(12) United States Patent
Zhang et al.

(10) Patent No.: US 10,453,684 B1
(45) Date of Patent: Oct. 22, 2019

(54) METHOD FOR PATTERNING A MATERIAL LAYER WITH DESIRED DIMENSIONS

(71) Applicant: Applied Materials, Inc., Santa Clara, CA (US)

(72) Inventors: Ying Zhang, Santa Clara, CA (US); Lin Zhou, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/975,408

(22) Filed: May 9, 2018

(51) Int. Cl.
| | |
|---|---|
| H01L 21/027 | (2006.01) |
| H01L 21/311 | (2006.01) |
| H01L 21/683 | (2006.01) |
| H01L 21/3213 | (2006.01) |
| C23C 16/455 | (2006.01) |

(52) U.S. Cl.
CPC .... *H01L 21/0274* (2013.01); *C23C 16/45536* (2013.01); *H01L 21/31116* (2013.01); *H01L 21/31144* (2013.01); *H01L 21/32137* (2013.01); *H01L 21/6833* (2013.01)

(58) Field of Classification Search
CPC .................................................. H01L 21/0274
USPC .......................................................... 216/72
See application file for complete search history.

(56) References Cited

U.S. PATENT DOCUMENTS

| | | | |
|---|---|---|---|
| 4,484,979 A | * | 11/1984 | Stocker ............... H01L 21/0337 252/79.1 |
| 6,905,972 B2 | | 6/2005 | Oda |
| 7,097,716 B2 | | 8/2006 | Barnes et al. |
| 7,270,761 B2 | | 9/2007 | Wang et al. |
| 9,484,220 B2 | | 11/2016 | Hoinkis et al. |
| 2003/0010355 A1 | | 1/2003 | Nowak et al. |
| 2003/0100190 A1 | | 5/2003 | Cote et al. |
| 2004/0077511 A1 | | 4/2004 | Barnes et al. |
| 2009/0317978 A1 | | 12/2009 | Higashi |
| 2012/0040536 A1 | | 2/2012 | Furuta et al. |
| 2013/0087174 A1 | | 4/2013 | Sun et al. |
| 2014/0024143 A1 | | 1/2014 | Li et al. |

FOREIGN PATENT DOCUMENTS

WO 2014088918 A1 6/2014

OTHER PUBLICATIONS

International Search Report and Written Opinion for PCT/US2019/031178 dated Aug. 21, 2019.

* cited by examiner

*Primary Examiner* — Roberts P Culbert
(74) *Attorney, Agent, or Firm* — Patterson + Sheridan, LLP

(57) ABSTRACT

Methods for patterning a film stack are provided. In one embodiment, a method for patterning a film stack disposed on a substrate includes performing a first etching process to etch a film stack disposed on a substrate, wherein the film stack includes a patterned photoresist layer disposed on an upper layer on a lower layer disposed on the substrate, wherein the patterned photoresist layer comprises openings defined between features and the features have a first pitch, wherein the first etching process removes between about 40 percent and about 95 percent of the lower layer exposed by the patterned photoresist layer from the film stack, performing a second etching process on the film stack, and upon completion of the second etching process, transferring the features into the upper or lower layer in the film stack having a second pitch, wherein the second pitch is shorter than the first pitch.

20 Claims, 13 Drawing Sheets

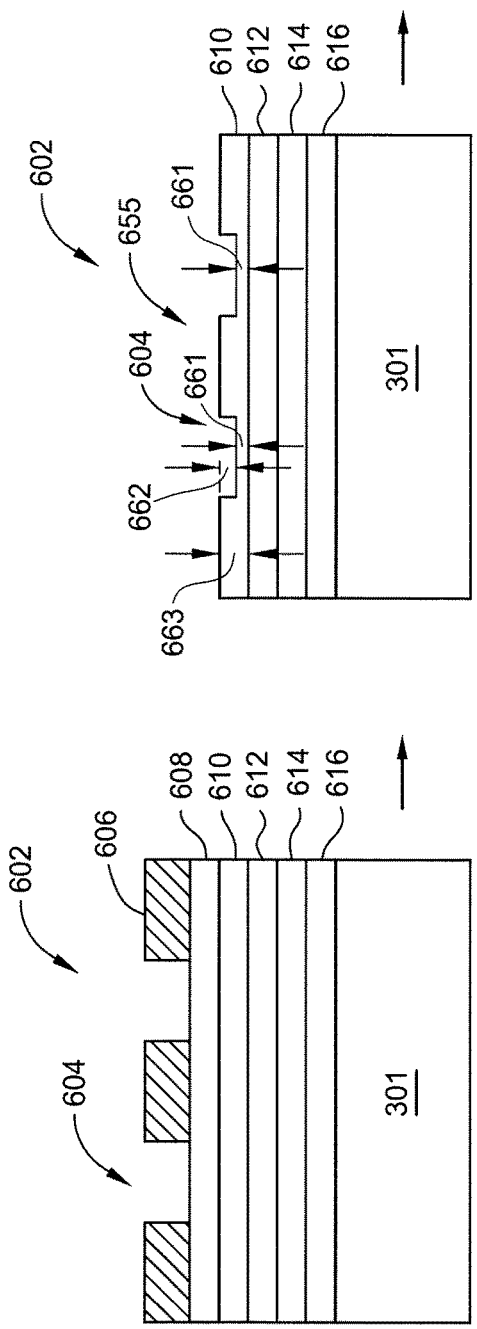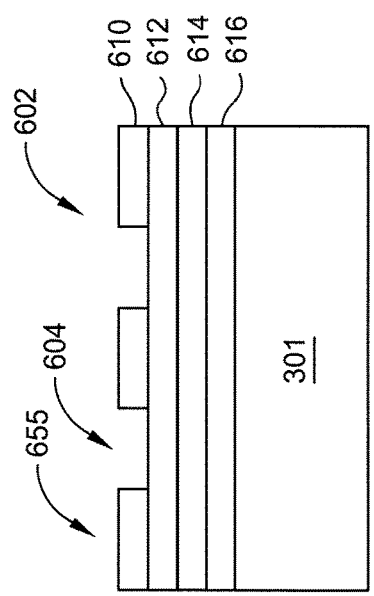

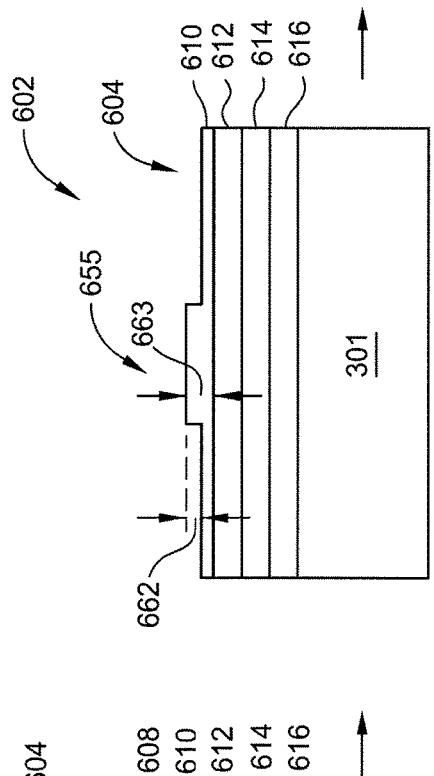
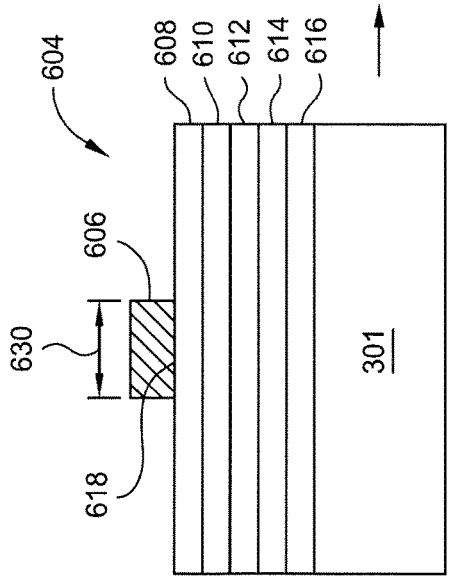
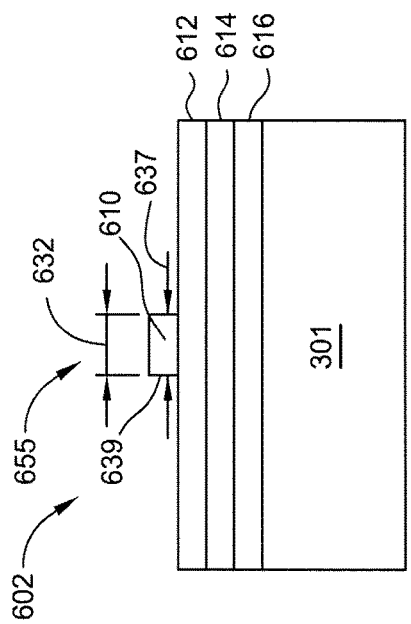

METHOD FOR PATTERNING A MATERIAL LAYER WITH DESIRED DIMENSIONS

BACKGROUND

Field

Examples of the present disclosure generally relate to patterning features and/or openings in a material layer. Particularly, embodiments of the present disclosure provide methods for patterning features and/or openings in a material layer with precision dimension control.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrink of critical dimensions (CD), present optical lithography is approaching a technological limit at the 45 nanometer (nm) technology node. Next generation lithography (NGL) is expected to replace the conventional optical lithography method, for example, in the beyond 20 nm technology node and beyond. The images of the patterned mask are projected through the high-precision optical system onto the substrate surface, which is coated with a layer of photoresist layer. The patterns are then formed on the substrate surface after complex chemical reactions and follow-on manufacturing steps, such as development, post-exposure bake and wet or dry etching.

Multiple patterning technique is a technology developed for photolithography to enhance the feature density and accuracy. This technique is commonly used for patterns in the same layer which look different or have incompatible densities or pitches. However, when doing the patterning in the same material layer, the micro-loading effect sometimes occurs when there are feature densities formed at different locations in the material layer. The microloading effect is a measure of the variation in etch dimensions between regions of high and low feature density. The low feature density regions (e.g., isolated regions) receive more reactive etchants per unit surface area compared to the high feature density regions (e.g., dense regions) due to larger total expose of surface area in the dense regions, thus resulting in a higher etching rate in the low density regions. Thus, due to different etch rates in high and low feature density regions, it is often observed that while the low feature density regions have been etched and defined in a certain desired and controlled vertical dimension, the high feature density regions are bowed and/or undercut by the lateral attacking due to the insufficient sidewall passivation or insufficient etching selectivity of the adjacent layers disposed in the film stack to sustain the film stack until completion of the etching process. In many cases, the low feature density regions are often etched at a faster rate than the high feature density regions, resulting in a deformation, mushroom shape or tapered bottom portion of the etched layer in the low feature density regions. Insufficient selectivity or protection among the material layers disposed in the film stack in high and low feature density regions often results in inability to hold critical dimension of the etch features and poor patterned transfer.

Therefore, there is a need for patterning features with precise dimension control during the patterning process.

SUMMARY

Embodiments of the present disclosure provide methods for patterning features in a film stack with desired dimension control. In one embodiment, a method for patterning a film stack disposed on a substrate includes performing a first etching process to etch a film stack disposed on a substrate, wherein the film stack includes a patterned photoresist layer disposed on an upper layer on a lower layer disposed on the substrate, wherein the patterned photoresist layer comprises openings defined between features and the features have a first pitch, wherein the first etching process removes between about 40 percent and about 95 percent of the lower layer exposed by the patterned photoresist layer from the film stack, performing a second etching process on the film stack, and upon completion of the second etching process, transferring the features into the upper or lower layer in the film stack having a second pitch, wherein the second pitch is shorter than the first pitch.

In another example, a method for patterning a film stack includes performing a directional etching process by supplying a gas mixture comprising an inert gas to etch a film stack on a substrate, and laterally reducing a dimension of features formed in the film stack from a first pitch to a second pitch.

In yet another example, a method for patterning a film stack includes providing etchants horizontally to a sidewall of a film stack disposed on a substrate, wherein the etchants comprises an inert gas, wherein the film stack comprises features formed in an upper layer disposed on a lower layer, and reducing a dimension of the features in the upper layer in the film stack from a first pitch to a second pitch while maintaining the dimension of the lower layer at the first pitch.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

FIGS. 8A-8C illustrate another example of cross sectional views of a sequence for the patterning process of FIG. 4;

FIGS. 9A-9C illustrate another example of cross sectional views of a sequence for the patterning process of FIG. 4;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features and manufacturing nanostructures with desired small dimensions in a film stack are provided. The methods utilize a directional etching process to pattern material layers in the film stack layer at a desired angle, so as to laterally or directionally etch the material layers as needed. By doing so, an etching rate may be altered or modified while etching the features in the material layer in the film stack with different feature densities so as to improve etching selectivity and enhance feature transfer dimension and profile control.

The term "substrate" as used herein refers to a layer of material that serves as a basis for subsequent processing operations and includes a surface to be cleaned. For example, the substrate can include one or more material containing silicon containing materials, IV group or III-V group containing compounds, such as Si, polysilicon, amorphous silicon, Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Figure 1:
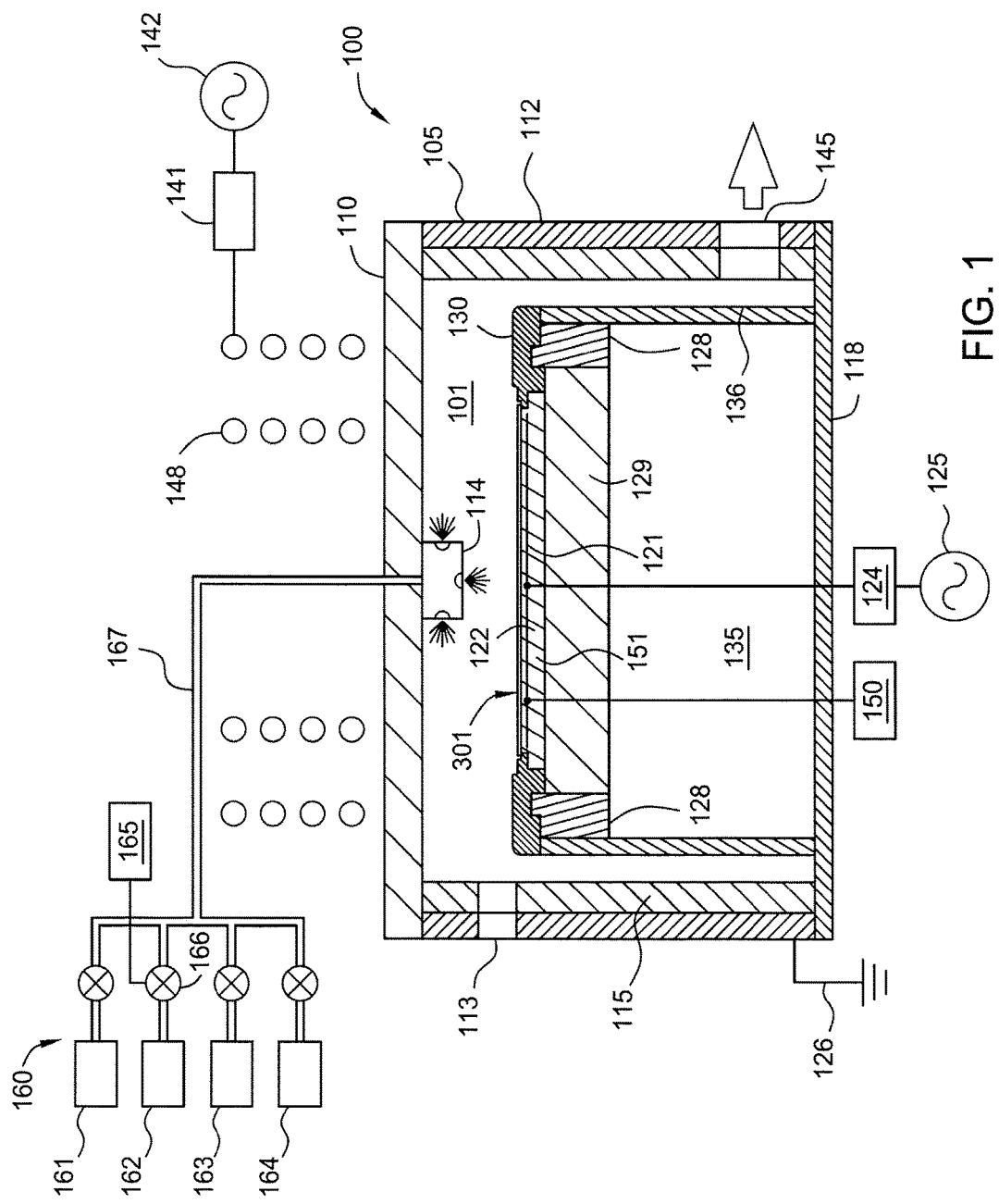
FIG. 1 is a schematic cross-sectional view of a processing chamber configured to perform an etching process according to one or more embodiments of the disclosure.

FIG. 1 is a simplified cutaway view for an exemplary processing chamber 100 suitable for patterning a material layer disposed on a substrate 301 in the processing chamber 100. The exemplary processing chamber 100 is suitable for performing a patterning process. One example of the processing chamber 100 that may be adapted to benefit from the disclosure is an CENTRIS® Sym3™ etching processing chamber, available from Applied Materials, Inc., located in Santa Clara, Calif. It is contemplated that other process chambers, including those from other manufactures, may be adapted to practice embodiments of the disclosure.

The plasma processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and generally are proportionally larger than the size of the substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the plasma processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine (ClO, nitrogen ($N_2$), helium (He) and oxygen gas ($O_2$). Additionally, process gasses may include chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the plasma processing chamber 100, the gases are energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 301 and/or above the substrate 301 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 is disposed in the chamber volume 101 to support the substrate 301 during processing. The substrate support pedestal 135 may include an electrostatic chuck 122 for holding the substrate 301 during processing. The electrostatic chuck (ESC) 122 uses the electrostatic attraction to hold the substrate 301 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 301 positioned thereon. The RF power supply 125 may cycle on and off, or pulse, during processing of the substrate 301. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 301.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 301 disposed thereon. The ESC 122 is configured to perform in the temperature range required by the thermal budget of the device being fabricated on the substrate 301. For example, the ESC 122 may be configured to maintain the substrate 301 at a temperature of about minus about 25 degrees Celsius to about 500 degrees Celsius for certain embodiments.

The cooling base 129 is provided to assist in controlling the temperature of the substrate 301. To mitigate process drift and time, the temperature of the substrate 301 may be maintained substantially constant by the cooling base 129 throughout the time the substrate 301 is in the cleaning chamber. In one embodiment, the temperature of the substrate 301 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 301, while shielding the top surface of the substrate support pedestal 135 from the plasma environment inside the plasma processing chamber 100. Lift pins (not shown) are selectively moved through the substrate support pedestal 135 to lift the substrate 301 above the substrate support pedestal 135 to facilitate access to the substrate 301 by a transfer robot (not shown) or other suitable transfer mechanism.

The controller 165 may be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2A:
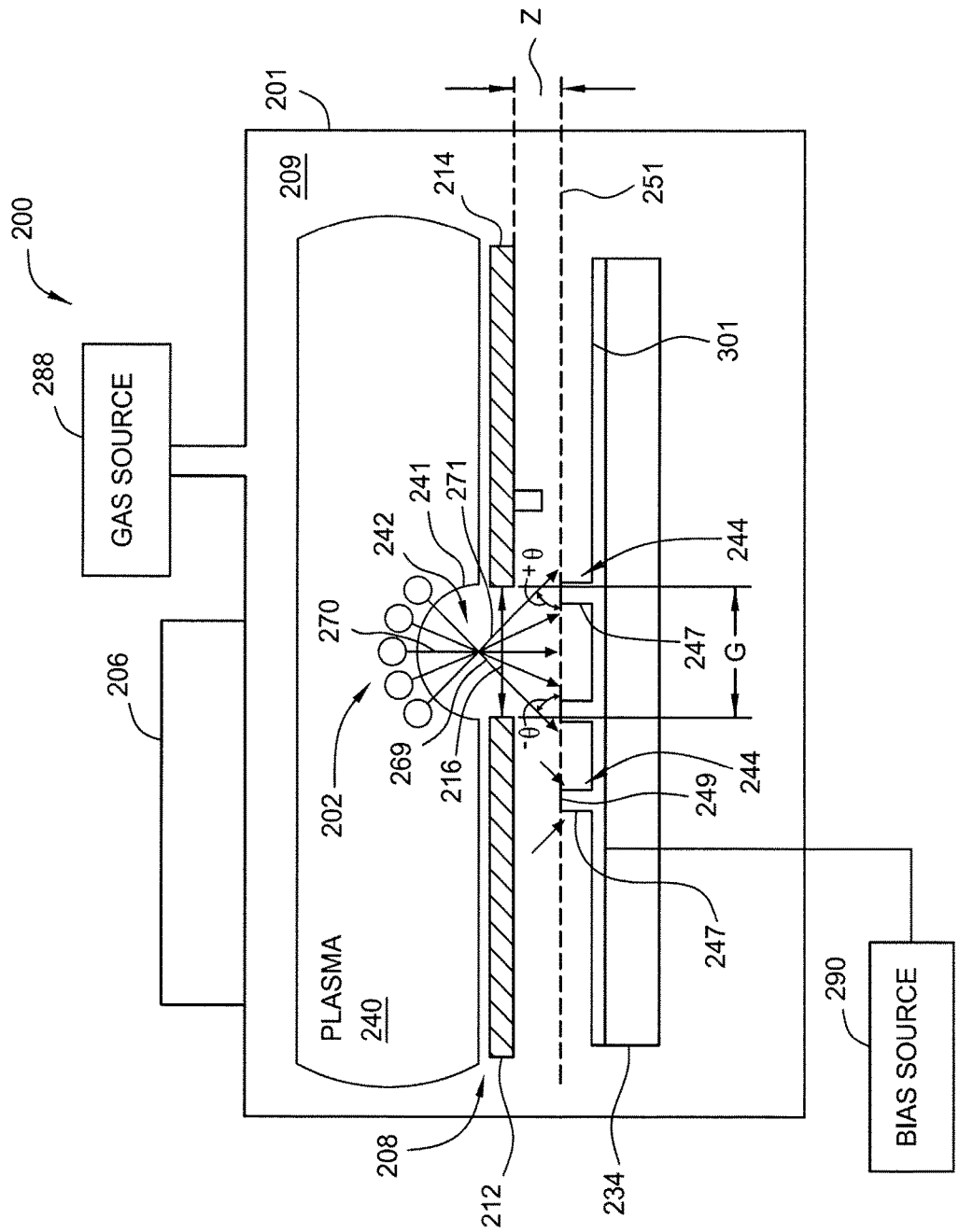
FIG. 2A depicts an apparatus which may be utilized to dope dopants in a structure on a substrate.

FIG. 2A is a sectional view of one embodiment of a processing chamber 200 suitable for providing ions, dopants or etchants into a substrate. Suitable processing chambers that may be adapted for use with the teachings disclosed herein include, for example, a processing chamber available from Applied Materials, Inc. of Santa Clara, Calif. Although the processing chamber 200 is shown having a plurality of features that enable directional etching/patterning performance, it is contemplated that other processing chambers from other manufactures may also be adapted to benefit from one or more of the inventive features disclosed herein. The processing chamber 200 as described herein may be utilized as a directional etching/patterning apparatus. However, the processing chamber 200 may also include, but not be limited to, etching and deposition systems. Furthermore, the directional etching/patterning apparatus can perform many differing material etching or patterning processes on a substrate. One such process includes etching a material layer disposed on a substrate, such as a semiconductor substrate, with desired etchants at a desired angle or direction.

A RF plasma source 206 is coupled to the chamber body 201 and configured to generate a plasma 240 in the processing chamber 200. In the embodiment of FIG. 2A, a plasma sheath modifier 208 is disposed in the interior processing region 209. The plasma sheath modifier 208 includes a pair of modifiers 212, 214 defining a gap 216 therebetween. The gap 216 defines a horizontal spacing (G). In some embodiments, the plasma sheath modifier 208 may include an insulator, conductor or semiconductor. The pair of modifiers 212, 214 may be a pair of sheets having a thin, flat shape. In other embodiments, the pair of modifiers 212, 214 may be other shapes such as tube shaped, wedge shaped, and/or have a beveled edge proximate the gap 316. In one embodiment, the modifiers 212, 214 may be fabricated of quartz, alumina, boron nitride, glass, polysilicon, silicon nitride, silicon carbide, graphite and the like.

In one embodiment, the horizontal spacing of the gap 216 defined by the pair of modifiers 212, 214 may be about 6.0 millimeters (mm). The pair of modifiers 212, 214 may also be positioned to define a vertical spacing (Z) above a plane 251. The plane 251 is defined by a front surface of the substrate 238 or a surface of the substrate support 234. In one embodiment, the vertical spacing (Z) may be about 3.0 mm.

A gas source 288 is coupled to the processing chamber 200 to supply an ionizable gas to the interior processing region 209. Examples of a patterning gas include, but are not limited to, Ar, $O_2$, HBr, $BF_3$, $BI_3N_2$, Ar, $PH_3$, $AsH_3$, $B_2H_6$, $H_2$, Xe, Kr, Ne, He, $SiH_4$, $SiF_4$, $SF_6$, $C_2F_6$, $CHF_3$, $GeH_4$, $GeF_4$, $CH_4$, $CF_4$, $AsF_5$, $PF_3$ and $PF_5$. The plasma source 206 may generate the plasma 240 by exciting and ionizing the gas provided to the processing chamber 200. Ions in the plasma 240 may be attracted across the plasma sheath 242 by different mechanisms. In the embodiment of FIG. 2A, a bias source 290 is coupled to the substrate support 234 configured to bias the substrate 301 to attract ions 202 from the plasma 240 across the plasma sheath 242. The bias source 290 may be a DC power supply to provide a DC voltage bias signal or an RF power supply to provide an RF bias signal.

It is believed that the plasma sheath modifier 208 modifies the electric field within the plasma sheath 242 to control a shape of the boundary 241 between the plasma 240 and the plasma sheath 242. The boundary 241 between the plasma 240 and the plasma sheath 242 may have a convex shape relative to the plane 251. When the bias source 290 biases the substrate 301, ions 202 are attracted across the plasma sheath 242 through the gap 216 defined between the modifiers 212, 214 through a large range of incident angles. For instance, ions 202 following trajectory path 271 may strike the substrate 301 at an angle of positive θ (+θ) relative to the plane 251. Ions following trajectory path 270 may strike perpendicularly on the substrate 301 at about an angle of about 90 degrees relative to the same plane 251. Ions following trajectory path 269 may strike the substrate 301 at an angle of negative θ (−θ) relative to the plane 251. Accordingly, the range of incident angles may be between about positive θ (+θ) and about negative θ (−θ), centered about 90 degrees. In addition, some ion trajectories paths such as paths 269 and 271 may cross each other. Depending on a number of factors including, but not limited to, the horizontal spacing (G) between the modifiers 212 and 214, the vertical spacing (Z) of the plasma sheath modifier 208 above the plane 251, the dielectric constant of the modifiers 212 and 214, and other plasma process parameters, the range of incident angles (θ) may be between +60 degree and −60 degree centered about 0 degree. Hence, small three dimensional structures on the substrate 301 may be treated uniformly by the ions 202. For example, sidewalls 247 of the features 244 having an exaggerated size for clarity of illustration, may be more uniformly treated by the ions 202, along with a top surface 249.

Figure 2B:
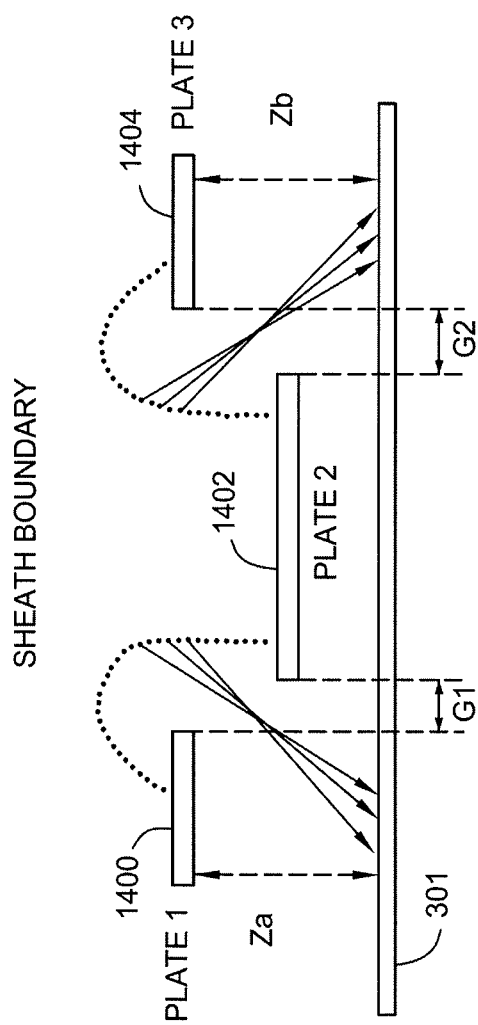
FIG. 2B depicts another embodiment of an apparatus which may be utilized to dope dopants in a structure on a substrate.

Referring to FIG. 2B, instead of a pair of modifiers 212, 214 depicted in FIG. 2A, at least three modifiers 1400, 1402, 1404 are used to control the ions with desired angular distribution to the substrate 301. By arranging the outer modifiers 1400, 1404 on a common plane equally shaped a distance Za above the substrate 301, the same vertical plane (Za), and by maintaining equal horizontal spacing G1, G2 between the modifiers 1400, 1402, 1404, a symmetric bimodal angular spread of ions, centered about +/−θ(+θ and −θ) degrees may be obtained. As described above, the incidental angles ions doped onto the substrate 301 may be modified by varying the vertical spacing between the outer modifiers 1400, 1404 and the middle modifier 1402, so as to vary the gap angles. The angular ion spread can be modified by varying the horizontal spacing (G1, G2) between the modifiers 1400, 1402, 1404, so as to vary the gap width defined by the horizontal spacing (G1, G2). An asymmetric distribution can be created by making Za different than Zb, by choosing G1 different than G2, or a combination of both actions. In one embodiment, the angular ion spread can be modified from between about 0 degree and about 30 degrees from the center to only treat or implant ions into one side of a feature.

Figure 3:
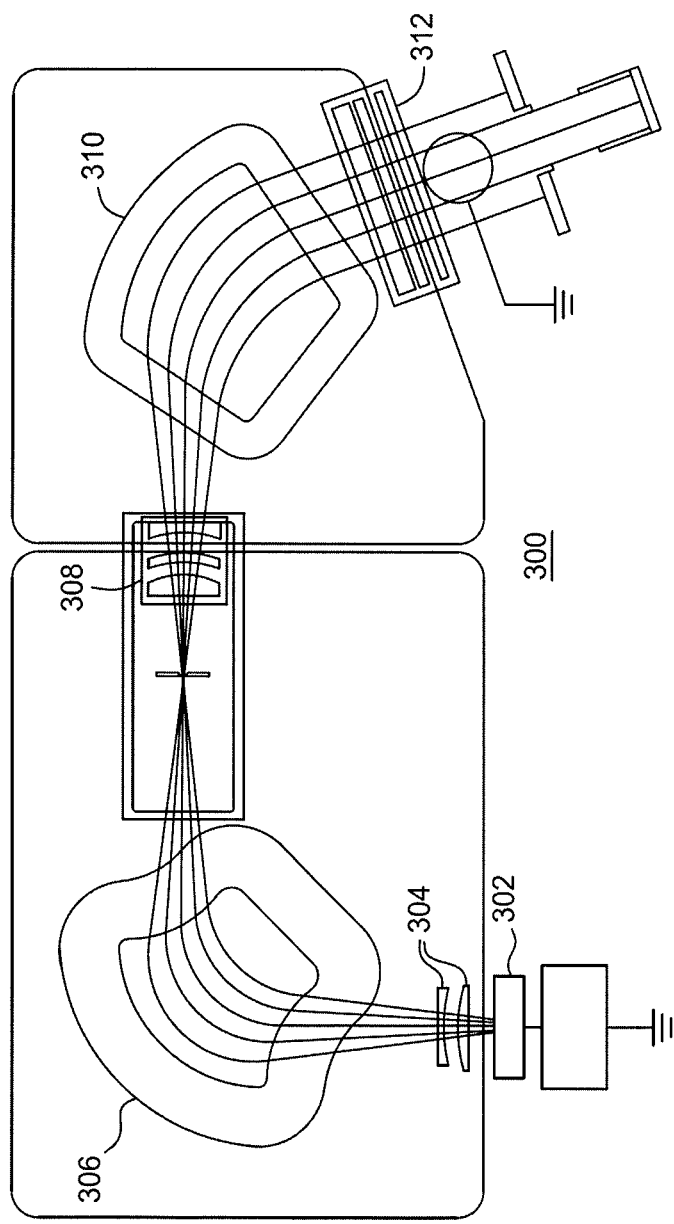
FIG. 3 depicts another embodiment of an apparatus which may be utilized to dope dopants in a structure on a substrate.

FIG. 3 depicts a directional etching/doping/patterning processing chamber 300 that may be utilized to provide ions, dopants or etchants into certain regions of the substrate. The etching/doping/patterning chamber processing includes an ion source 302, extraction electrodes 304, a 90 degree magnet analyzer 306, a first deceleration (D1) stage 308, a magnet analyzer 310, and a second deceleration (D2) stage 312. The deceleration stages D1, D2 (also known as "deceleration lenses") are each comprised of multiple electrodes with a defined aperture to allow an ion beam to pass therethrough. By applying different combinations of voltage potentials to the multiple electrodes, the deceleration lenses D1, D2 can manipulate ion energies and cause the ion beam to hit a target wafer at a desired energy which implants ions into a substrate. The above-mentioned deceleration lenses D1, D2 are typically electrostatic triode (or tetrode) deceleration lenses.

Figure 4:
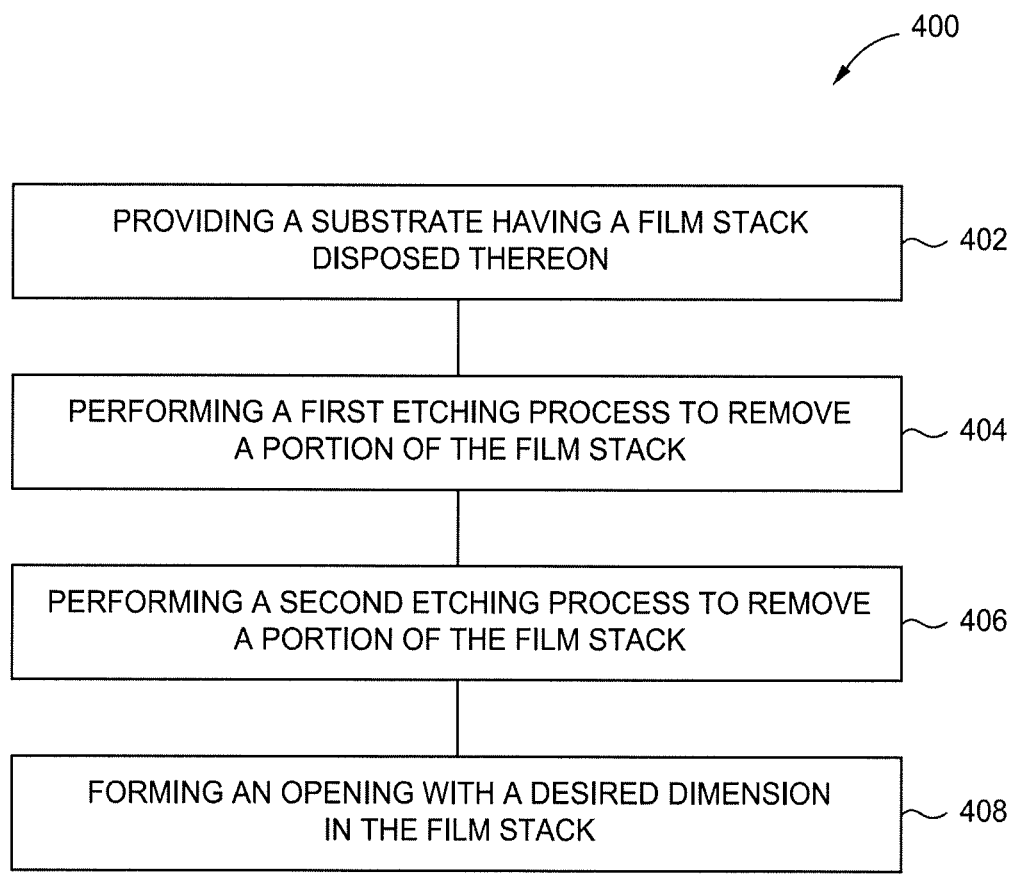
FIG. 4 is a flowchart of a method for performing a patterning process, according to one or more embodiments of the present disclosure.

FIG. 4 is a flow diagram of one example of a method 400 for patterning features in a film stack disposed on a substrate. The material layer may be later utilized to serve as an etching mask layer to further transfer features into another structure disposed underneath the material layer. FIGS. 6A-6D and 7A-7D are cross-sectional views of a portion of a film stack 602 with multiple mask layers (e.g., layers of 606, 608, 610, 612, 614, 616) corresponding to various stages of the method 400. The cross sectional view of FIGS. 6A-6D shows the portion of the film stack 602 cutting along the line A-A from the top view of the film stack 602 in FIGS. 5A and 5B. The cross sectional view of FIGS. 7A-7D shows the portion of the film stack 602 cutting along the line B-B from the top view of the film stack 602 in FIGS. 5A and 5B. The method 400 may be utilized to pattern features into at least one of the multiple mask layers (e.g., layers of 606, 608, 610, 612, 614, 616) in the film stack 602. The multiple mask layer (e.g., layers of 606, 608, 610, 612, 614, 616) may be utilized as an etching mask to form features in a material layer on the substrate 301, such as a interlayer dielectric layer, contact dielectric layer, a gate electrode layer, a gate dielectric layer, a STI insulating layer, inter-metal layer (IML), or any suitable layers. Alternatively, the method 400 may be beneficially utilized to etch any other types of structures as needed.

The method 400 begins at block 402 by providing the film stack 602 having the multiple mask layers (e.g., layers of 606, 608, 610, 612, 614, 616) disposed on the substrate 301. The substrate 301 is placed in a processing chamber, such as the processing chamber 100 depicted in FIG. 1 to perform an etching process. The film stack 602 includes a patterned photoresist layer 606 disposed on an upper layer 608, a lower layer 610, a first dielectric layer 612, a metal dielectric layer 614 and a second dielectric layer 616. It is noted that a material layer (e.g., additional layers as needed) may be formed between the second dielectric layer 616 and the substrate 301 so as to further transfer the features defined from the film stack 602 to the material layer as needed. These multiple mask layers (e.g., layers of 606, 608, 610, 612, 614, 616) in the film stack 602 will be patterned to later serve as an etching mask to transfer features to a material layer disposed thereunder during an etching process. The material layer (not shown) formed underneath the second dielectric layer 616 may have the features formed in the second dielectric layer 616 transferred into the material layer. In one embodiment, the material layer may be a dielectric layer utilized to form a layer in a semiconductor device. Suitable examples of the dielectric layer include carbon-containing silicon oxides (SiOC), polymer materials, such as polyamides, SOG, USG, silicon oxide, silicon nitride, silicon oxynitride, silicon carbide, silicon oxycarbide, or the like.

In one example, the patterned photoresist layer 606, such as a photoresist layer for extreme ultraviolet (EUV) applications, is formed on the upper layer 608. The patterned photoresist layer 606 is an organic resist layer. The photoresist layer patterned 606 may be patterned by suitable technologies to form openings 604 in the patterned photoresist layer 606.

Figure 5A:
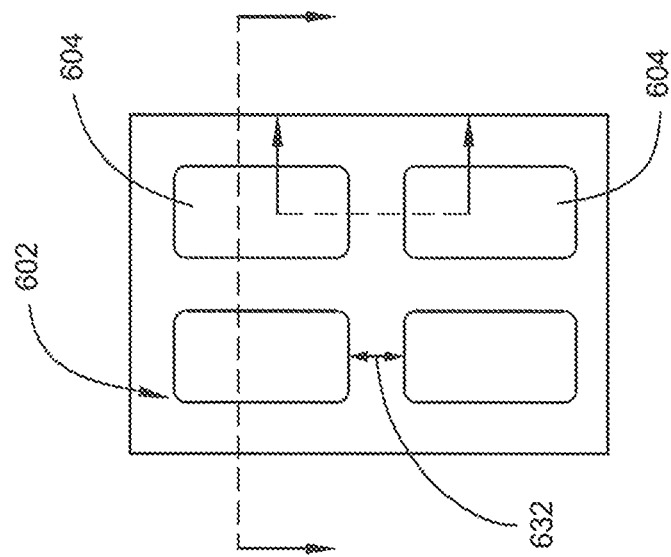
FIGS. 5A-5B illustrate top views of a substrate during the patterning process of FIG. 4.
Figure 5B:
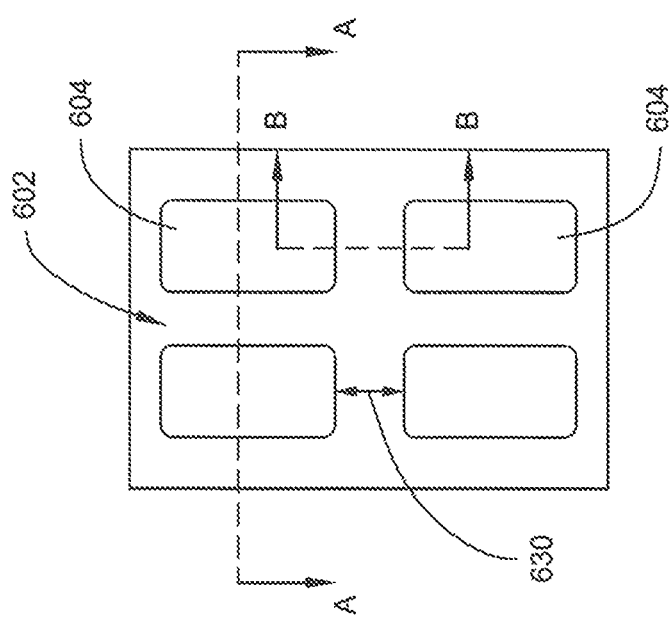
Figure 6B:
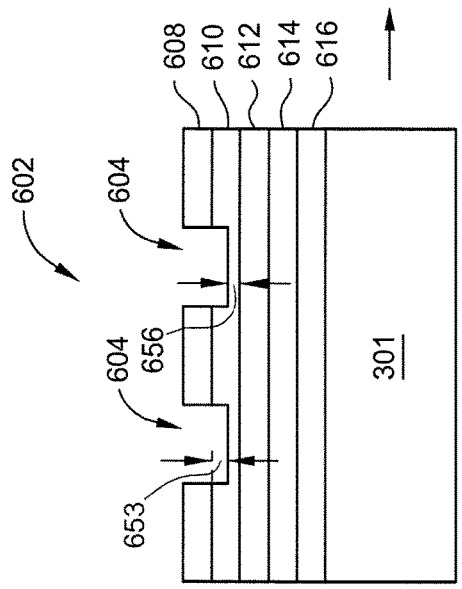
FIGS. 6A-6D illustrate one example of cross sectional views of a sequence for the patterning process of FIG. 4.
Figure 6D:
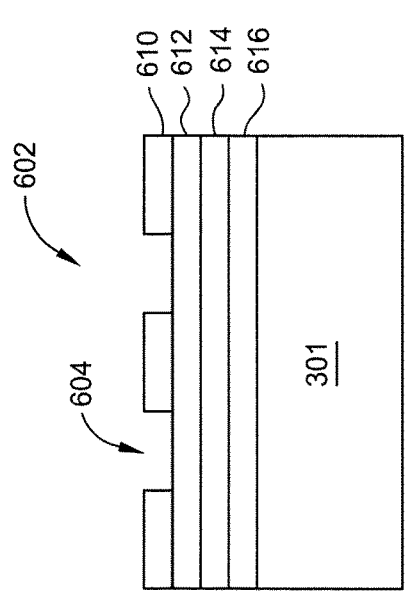
Figure 6A:
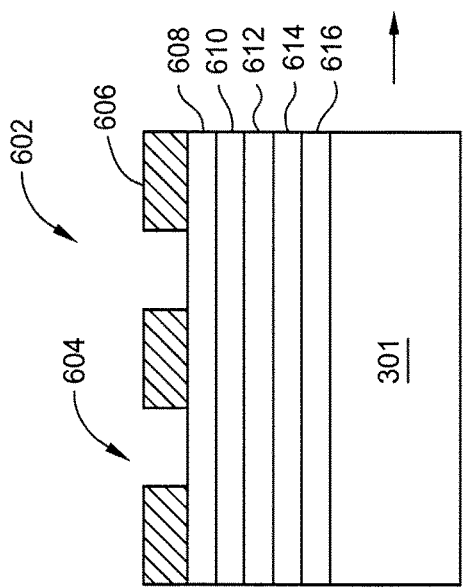
Figure 7A:
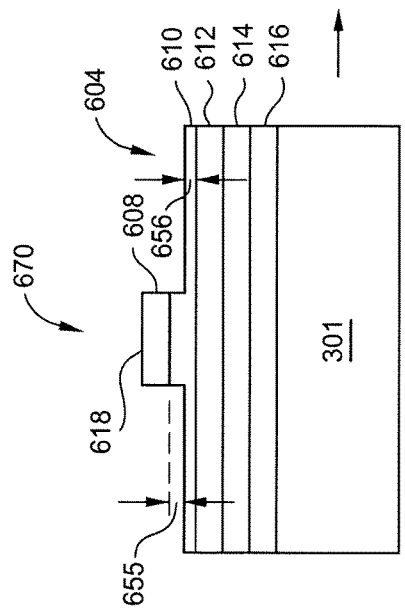
FIGS. 7A-7D illustrate another example of cross sectional views of a sequence for the patterning process of FIG. 4.

As shown in the top view depicted in FIG. 5A, the openings 604 is defined in the patterned photoresist layer 606, also shown in the cross sectional view in FIG. 6A along the cutting line A-A. The openings 604 defined in the patterned photoresist layer 606 along the cutting line B-B, as shown in the top view depicted in FIG. 5B, has a first pitch 630 defined therebetween, as shown in FIG. 7A. The first pitch 630 between the openings 604 affects the dimensions transferring into the underlying layer, such as the upper layer 608, the lower layer 610, and layers further below. Thus, further push the dimension of the first pitch 630 between the openings 604 assists forming features to the underlying layer, such as the upper layer 608, the lower layer 610, and layers further below, with further smaller dimensions to meet the requirements for the advanced technologies. Thus, by utilizing a directional etching/patterning process, which will be further discussed below, the first pitch 630 between the openings 604 may be further trimmed and pushed so as to form features in the film stack 602 with smaller dimensions, serving as an etching mask during the subsequent patterning/etching process.

In some embodiments, the upper layer 608 is a silicon containing layer, such as polysilicon, nanocrystalline silicon, amorphous silicon, silicon oxide, silicon nitride, silicon oxynitride, silicon carbide and silicon oxycarbide (SiOC). In one embodiment the upper layer 608 is a silicon oxycarbide (SiOC) layer. The lower layer 610 is a carbon containing material, such as a carbon polymer material, amorphous carbon layer, or other suitable carbon based materials. The first dielectric layer 612 is a silicon containing layer, such as polysilicon, nanocrystalline silicon, amorphous silicon, silicon oxide, silicon nitride, silicon oxynitride, silicon carbide and silicon oxycarbide (SiOC). In one example, the first dielectric layer 612 is a silicon oxide layer. The metal dielectric layer 614 is a titanium nitride, titanium oxide, titanium oxynitride, tantalum nitride, tantalum oxide, tantalum oxynitride, or any other suitable materials. In one particular example, the metal dielectric layer 614 is titanium nitride. Similarly, the second dielectric layer 616, similar to the first dielectric layer 612, is also a silicon containing layer, such as polysilicon, nanocrystalline silicon, amorphous silicon, silicon oxide, silicon nitride, silicon oxynitride, silicon carbide and silicon oxycarbide (SiOC). In one example, the second dielectric layer 616 is a silicon oxide layer.

Figure 7B:
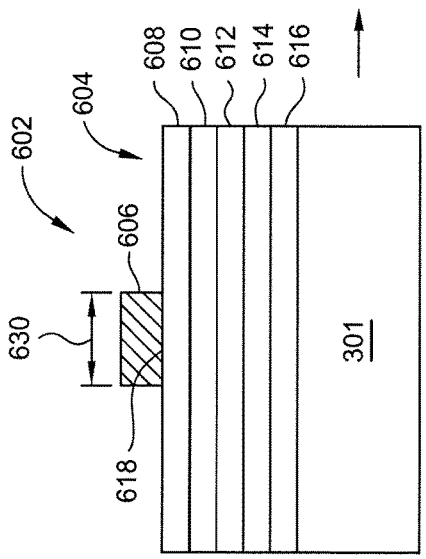

At operation 404, a first etching process is performed in the processing chamber, such as the processing chamber 100 of FIG. 1, to etch the film stack 602 through the openings 604 defined in the patterned photoresist layer 606, as shown in FIGS. 6B and 7B. The first etching process is performed by supplying a first etching gas mixture to the substrate 301 in the processing chamber 100 to at least etching a portion of the film stack 602.

In the example depicted in FIGS. 6B and 7B, the first etching process removes and etches away the upper layer 608 exposed by the patterned photoresist layer 606 and at least a portion of the lower layer 610 forming features 670 between the openings 604 in the film stack 602. It is believed that due to the microloading effect, the etchants received in the openings 604 in a first location with higher feature densities are different from the openings 604 in a second location with lower feature densities, resulting in different etching rates. Additionally, for advanced technologies with even smaller dimension requirement, further trimming down the dimensions of the features 670 is required. Thus, in order to enable a successful transfer of features 670 with the desired profile into the film stack 602 having multiple materials, different etching processes (e.g., different etching gas mixtures, etching mechanisms, or etching species with different incident angles) may be utilized at different stages while etching the film stack 602. As a result, the regions with relatively lower etching rate may be compensated or supplementally etched when switching to the different etching processes. For example, the dimension and/or the first pitch 630 between the openings 604 (e.g., the dimension of the features 670 depicted in FIG. 7B and the top view of FIGS. 5A-5B) is desired to be further pushed or reduced without adversely damaging or over-etching the underlying layers, e.g., especially for advanced technologies, a second etching process at operation 406 is followed to trim down the first pitch 630 (e.g., the dimension of the features 670) between the openings 604 while having a portion of the lower layer 610 remained in the film stack 602 to prevent the underlying layers from early attack or damage. Accordingly, the first etching process at operation 404 is configured to etch the upper layer 608 exposed by the patterned photoresist layer 606 away, leaving some portion of the lower layer 610 on the substrate 301 for protection during the subsequent etching/patterning process at operation 406.

In one example, the first etching process at operation 404 etches about 40% to about 95%, such as a first depth 653, of the lower layer 610 away from the film stack 602, leaving between about 5% and about 60% of a second depth 656 in the lower layer 610 on the substrate 301 for protection. In one example, the first etching process at operation 404 etches about 80% to about 95% of the lower layer 610 away from the film stack 602, leaving between about 5% and about 20% of the lower layer 610 on the substrate 301 for protection.

In one example, the first etching gas mixture comprises halogen containing gas, oxygen containing gas and a nitrogen containing gas. Suitable examples of the halogen containing gas include HBr, $CH_4$, $Cl_2$, $CF_4$, and the like. In one particular example, the first etching gas mixture includes HBr, $O_2$ and $N_2$.

During the supplying of the first etching gas mixture at operation 404, several process parameters may be controlled. In one embodiment, the a RF source power may be supplied to the plasma processing chamber 100 between about 200 Watts and about 1000 Watts, such as about 300 Watts, with or without RF bias power. When the RF bias power is utilized, the RF bias power may be controlled at between about 50 Watts and about 500 Watts. The pressure of the processing chamber may be controlled at a pressure range greater than 5 mTorr but less than 500 mTorr, such as between about 5 mTorr and about 200 mTorr, such as about 150 mTorr.

At operation 406, a second etching process is performed on the substrate 301. The second etching process may be performed in a separate chamber different from the processing chamber 100 where the first etching process at operation 404 is performed. For example, the second etching process may be performed at the processing chamber 200 depicted in FIGS. 2A and 2B, or the processing chamber 300 in FIG. 3. As discussed above, the processing chamber 200, 300 may perform a directional etching process that provides etchants, dopants, ions, or active species to a substrate surface with a desired incident angle to a selected region of the film stack 602 for etching. Thus, while providing etchants, dopants, ions, or active species to the selected region of the film stack 602, the non-selected region does not receive significant amount of etchants, dopants or ions, thus predominately and selectively trimming the selected region of the film stack 602. The etchants, dopants, ions, or active species may treat, bombard, modify atom/bonding structures of the selected region of the film stack 602, thus efficiently modifying the dimension of the selected region. Thus, by doing so, some odd corners or hidden edges under the upper mask layers (e.g., the upper layer 608) may be intentionally and specifically etched, trimmed, or modified. Thus, the second etching process performed at operation 406 is a directional etching process that can assist further trimming down or pruning certain locations of the film stack 602 to form the desired features 670 in the film stack 602 without damaging other locations of the film stack 602.

Figure 7C:
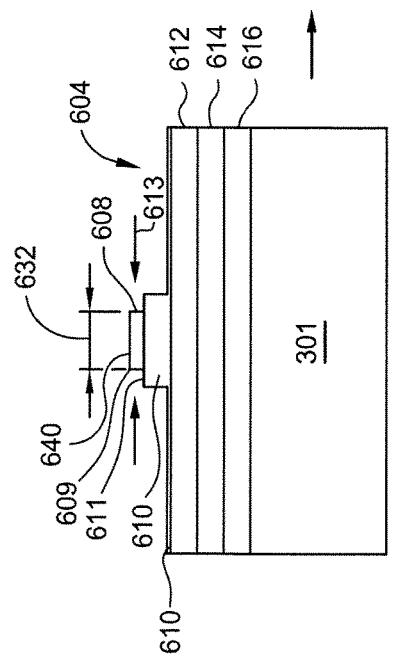

For example, the second etching process (e.g., the directional etching process) at operation 406 is performed to predominately trim the dimension of the features 670 in the upper layer 608 from the first pitch 630 to the second pitch 632, as shown in FIG. 7C, as well as the top view in FIG. 5B. In one example, the second pitch 632 is between about 20% and about 60% less than the first pitch 630. In one example, the second pitch 632 is between about 15 nm and about 45 nm. While performing the second etching process (e.g., the directional etching process) at operation 406, the portion, the second depth 656, of the lower layer 610 (as shown in FIG. 7B) may slightly be trimmed but continue remaining in the film stack 602 for underlying structure protection.

In one embodiment, the second etching process is performed by supplying a second gas mixture into the processing chamber. It is believed that the inert gas supplied in the second gas mixture can assist bombarding the surface of the film stack 602, thus gently trimming and modifying the profile and dimension of the upper layer 608. By utilizing the directional etching/patterning (e.g., the lateral etching in the example depicted in FIGS. 7C and 5B), the upper layer 608 may be predominately etched from its sidewalls 609 in a horizontal direction (e.g., with an incident angle about 0 degrees or about 180 degrees), as indicated by the arrow 613, thus trimming and shrinking the horizontal dimension of the upper layer 608 from the first pitch 630 to the second pitch 632. The ions and/or species from the second gas mixture, e.g., the inert gas, physically bombards and collides with the surface of the upper layer 608 without aggressively etching the upper layer 608 so that the surface and/or sidewalls 609 of the upper layer 608 may be gently and gradually trimmed and modified. After the upper layer 608 is trimmed to the second pitch 632, an edge portion 611 of the lower layer 610 is then exposed. The edge portion 611 of the lower layer 601 will be further etched in the subsequent etching process.

Figure 6C:
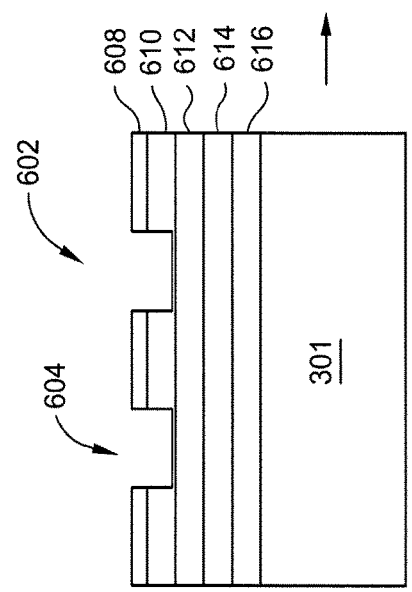

In one embodiment, the etchants, dopants, ions, or active species generated from the directional etching process has an incident angle between about 0 degrees and about 180 degrees, such as between about 0 degrees and about 60 degrees, or between about 120 degrees and about 180 degrees. With the desired and predetermined incident and directional angles, the etchants, dopants, ions, or active species may mainly collide with the film stack 602 to the predetermined regions, e.g., sidewalls 609 of the features 670 in the upper layer 608, with controlled incident angles, rather than only from the top of the upper layer 608 or globally formed across on the substrate. By doing so, some other regions, such as the surface 617 of the openings 604 as shown in FIG. 6C that is not intended to be etched, may be selectively and/or intentionally left out during (i.e., not subject to) the directional etching process.

In one example, the second gas mixture includes at least an inert gas and an oxygen containing gas. Suitable examples of the inert gas include Ar, He, Kr, Ne, Xe or the like. When an inert gas is selected as the second gas mixture for the directional etching process, the atoms from the inert gas physically bombard and collide with the atoms made up the upper layer 608. The power applied during the directional etching process may provide momentum to the atoms from the inert gas. The atoms with momentum collides with the atoms from the upper layer 608, thus selectively trimming and grinding away the area being interfaced with. In one embodiment, inert gas with high molecular weight, such as Ar, Ne, or Kr, may be selected to perform the directional treatment process. As these elements have relatively high molecular weight, a relatively higher collision power may be obtained when striking the surface (e.g., the sidewalls 609) of the upper layer 608 so as to provide an efficient collision to alter and trim the structure of the upper layer 608. The second gas mixture supplied in the second etching process (e.g., a directional etching process) includes Ar and $O_2$.

Several process parameters may be controlled during the directional etching process. The inert gas in the second gas mixture may be supplied into the processing chamber at a flow rate between about 10 sccm and about 200 sccm. The oxygen gas in the second gas mixture may be supplied into the processing chamber at a flow rate between about 1 sccm and about 500 sccm. The chamber pressure is generally maintained between about 0.1 mTorr and about 100 mTorr, such as about 10 mTorr. A RF power, such as capacitive or inductive RF power, DC power, electromagnetic energy, or magnetron sputtering, may be supplied into the processing chamber 200 or processing chamber 300 to assist dissociating the gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a RF field with a frequency of about 2 MHz is provided to ionize the ion implantation processing gas and bias the substrate support at a power level between about 100 W and about 10000 W. The ions thus produced will generally be accelerated toward the substrate by biasing the substrate or a gas distributor as described above.

Figure 7D:
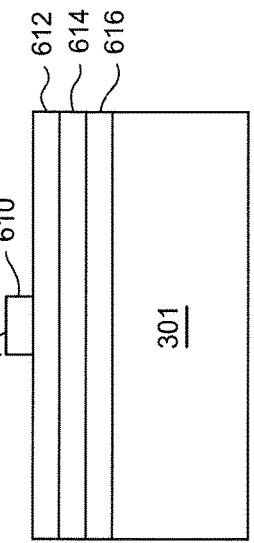

At operation 408, after the directional etching process at operation 406, an additional etching process may be optionally performed to form the openings with desired dimension in the film stack 602. In the example depicted in FIGS. 6D and 7D, an additional etching is performed to further transfer the desired dimension, e.g., the second pitch 632 defined in the upper layer 608, of the features 670 to the underlying lower layer 610. Such additional etching process is similar to the first etching process at operation 404. The etching process etches the lower layer 610 using the trimmed upper layer 608 (e.g., the features 670 formed in the upper layer 608) as an etching mask, transferring the features 670 into the lower layer 610 also having a dimension of the second pitch 632. In some embodiments, the additional etching process may not be necessary as the second etching process, e.g., the directional etching process, may successfully remove the upper layer 608 and trim down the lower layer 610 to the desired dimensions of the second pitch 632, as shown in FIGS. 6D and 7D, by proper control of the incident angles at different stages of the directional etching process.

In one example, the additional etching process, if performed, is similar to the etching process at operation 404 by supplying a third etching gas mixture, similar to the first etching gas mixture, in the processing chamber 100. The substrate 301 at this stage is transferred back to the processing chamber 100 from the processing chamber 200 or 300. Process parameters at the additional etching process are also controlled similar to the process parameters at operation 404 from the first etching process.

FIGS. 8A-8O and FIGS. 9A-9C depict another embodiment of the feature transfer process. The cross sectional view of FIGS. 8A-8C shows the portion of the film stack 602 cutting along the line A-A from the top view of the film stack 602 in FIGS. 5A and 5B. The cross sectional view of FIGS. 9A-9C shows the portion of the film stack 602 cutting along the line B-B from the top view of the film stack 602 in FIGS. 5A and 5B.

In this example, when performing the method 400 depicted in FIG. 4, the first etching process at operation 404 etches the film stack 602 through the openings 604 defined in the patterned photoresist layer 606, as shown in FIGS. 8A and 9A, until a portion of the lower layer 610 is removed, as shown in FIGS. 8B and 9B, forming features 655 in the film stack 602. The patterned photoresist layer 606 and the upper layer 608 are both removed. Thus, the etchants selected at this example are relatively more aggressive so as to remove both the patterned photoresist layer 606 and the upper layer 608 until a portion of the lower layer 610 is removed. Accordingly, in this example, the etching gas mixture selected for the first etching process includes at least a fluorine containing gas, such as $CF_4$, $CHF_3$ or $C_4F_6$ and the like. The fluorine containing gas can etch both the upper layer 608 and the lower layer 610 without selectivity. By proper processing time control, a portion of the lower layer 610 remains on the substrate 301 to provide protection while doing the second etching process (e.g., the directional etching process) at the following operation 406.

In one embodiment, the portion of the lower layer 610 remained on the substrate 301 has a first depth 661, which is about 5 percent to 60 percent, such as about 5 percent to 20 percent, of a total thickness 663 of the lower layer 610. In other words, the etching process at operation 404 etches away the upper layer 608 and etches a portion, such as between about 40 percent and 95 percent, for example between about 80 percent and about 95 percent, of the total thickness 663 of the lower layer 610. It is noted that the remaining portion, e.g., the first depth 661 of the lower layer 610 will be etched away while performing the second etching process, e.g., the directional etching process at the following process at operation 406.

In one example, the first etching gas mixture include a fluorine containing gas and an oxygen containing gas. In one embodiment, the first etching gas mixture includes $CHF_3$ or $CF_4$ and $O_2$. During the supplying of the first etching gas mixture at operation 404, several process parameters may be controlled. In one embodiment, the a RF source power may be supplied to the plasma processing chamber 100 between about 100 Watts and about 1000 Watts, such as about 300 Watts, with or without RF bias power. When the RF bias power is utilized, the RF bias power may be controlled at between about 50 Watts and about 500 Watts. The pressure of the processing chamber may be controlled at a pressure range greater than 0 mTorr but less than 500 mTorr, such as between about 5 mTorr and about 200 mTorr, such as about 150 mTorr. The processing time for performing the operation 404 for the example depicted in FIGS. 8B and 9B is between about 20 seconds and about 60 seconds.

Subsequently, as shown in FIGS. 8C and 9C, the second etching process at operation 406 is performed to laterally provide etchants, dopants, ions, or active species to a substrate surface with a desired incident angle to a selected region of in the lower layer 610, as shown by the arrow 637. Thus, while providing etchants, dopants, ions, or active species to through the sidewalls 639 of the lower layer 610, the dimension of the features 655 formed in the lower layer 610 is trimmed from the first pitch 630 to the second pitch 632. Similarly, etchants, dopants, ions, or active species may efficiently modify the dimension of the features 655 in the lower layer 610. The second etching process (e.g., the directional etching process) at operation 406 is performed to predominately trim the dimension of features 655 the lower layer 610 from the first pitch 630 to the second pitch 632, as shown in FIG. 7C, as well as shown the top view in FIG. 5B.

During the second etching process (e.g., the directional etching process), the remaining portion, e.g., the first depth 661, of the lower layer 610 is also etched away. Thus, at the completion of the second etching process, the features 655 of the lower layer 610 is trimmed from the first pitch 630 to the second pitch 632 as well as removing the remaining portion, e.g., the first depth 661 of the lower layer 610, away from the substrate 301, as shown in FIGS. 8C and 9C. Thus, The features 655 formed in the lower layer 610 may further serve as an etching mask for the following patterning process in the film stack 602.

In one embodiment, the second etching process at operation 406 is similar to the second etching process performed above to trim the features 670 from the first pitch 630 to the second pitch 632, as shown in FIGS. 6C and 7C. The second etching process is performed by supplying a second gas mixture into the processing chamber. In one embodiment, the etchants, dopants, ions, or active species generated from the directional etching process has an incident angle between about 0 degrees and about 90 degrees. The second gas mixture includes at least an inert gas and an oxygen containing gas. Suitable examples of the inert gas include Ar, He, Kr, Ne, Xe or the like. When an inert gas is selected as the second gas mixture for the directional etching process, the atoms from the inert gas physically bombard and collide with the atoms made up the lower layer 610. The second gas mixture supplied in the second etching process (e.g., a directional etching process) includes Ar and $O_2$.

Several process parameters may be controlled during the directional etching process. The inert gas in the second gas mixture may be supplied into the processing chamber at a flow rate between about 10 sccm and about 200 sccm. The oxygen gas in the second gas mixture may be supplied into the processing chamber at a flow rate between about 1 sccm and about 500 sccm. The chamber pressure is generally maintained between about 0.1 mTorr and about 100 mTorr, such as about 10 mTorr. A RF power, such as capacitive or inductive RF power, DC power, electromagnetic energy, or magnetron sputtering, may be supplied into the processing chamber 200 or processing chamber 300 to assist dissociating the gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a RF field with a frequency of about 2 MHz is provided to ionize the ion implantation processing gas and bias the substrate support at a power level between about 100 W and about 10000 W. The ions thus produced will generally be accelerated toward the substrate by biasing the substrate or a gas distributor as described above.

At operation 408, after the second etching process at operation 406, the openings 604 formed between the features 655 have the desired dimension formed therein, as shown in FIGS. 8C and 9C with the top view of FIG. 5B.

It is noted that the first etching process and the second etching process at operation 404 and 406 includes a plasma etching process, which utilizes a RF plasma source, and a directional etching process, which utilizes a ion source, respectively, to facilitate the feature transfer in the film stack 602. It is also noted that the order of the first etching process, which is a plasma etching process utilizing a RF plasma source, and the second etching process, which is a directional etching process utilizing an ion source, may be performed in reversed order as needed.

Figure 10:
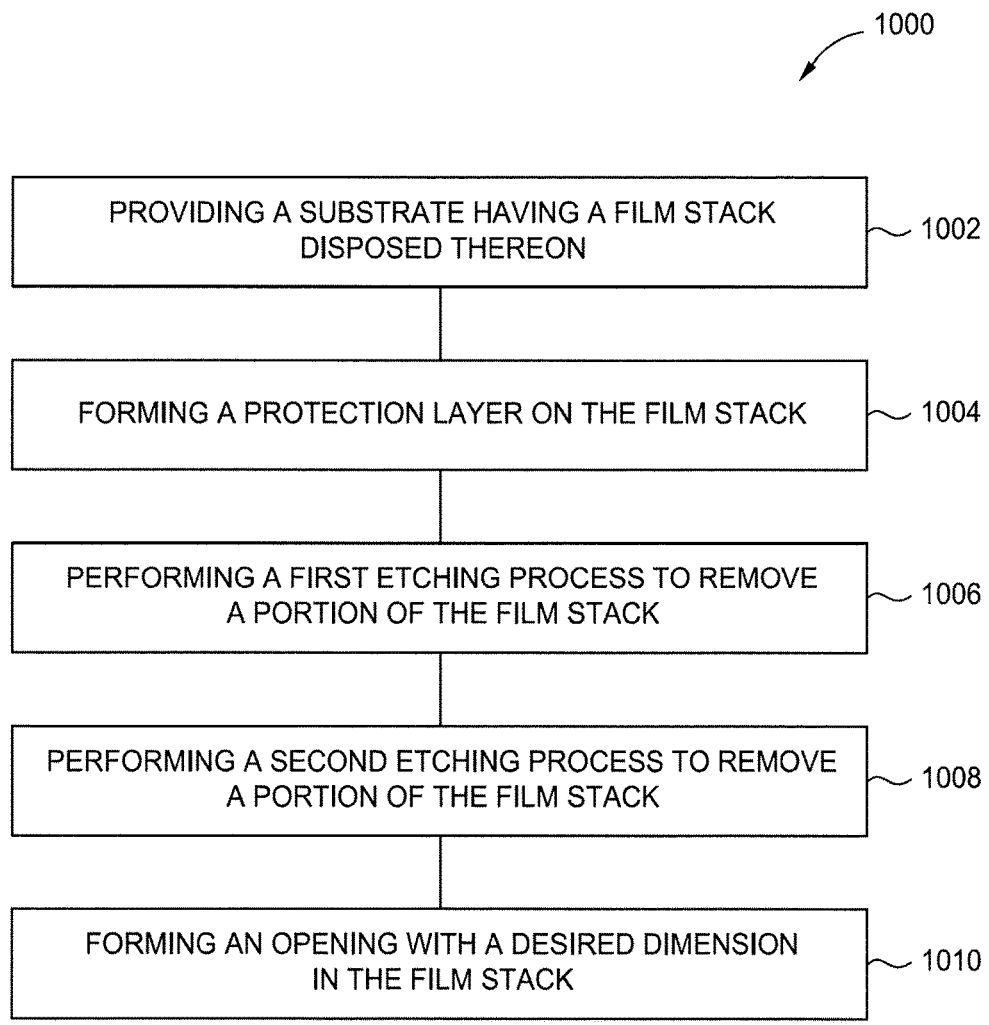
FIG. 10 is a flowchart of a method for performing a patterning process, according to one or more embodiments of the present disclosure.
Figure 11A:
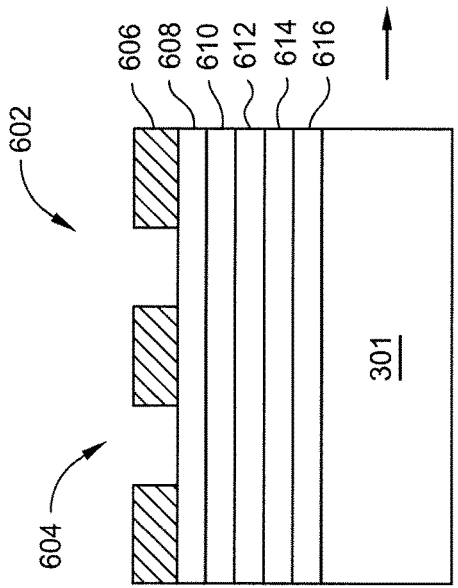
FIGS. 11A-11C illustrate another example of cross sectional views of a sequence for the patterning process of FIG. 10.
Figure 11B:
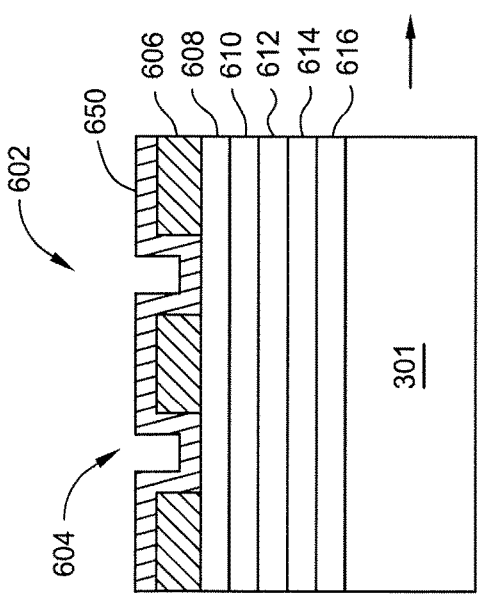
Figure 11C:
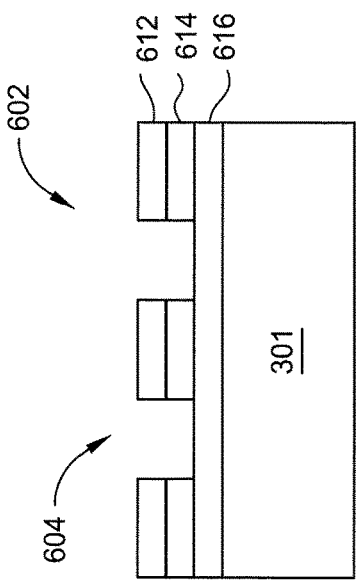
Figure 12B:
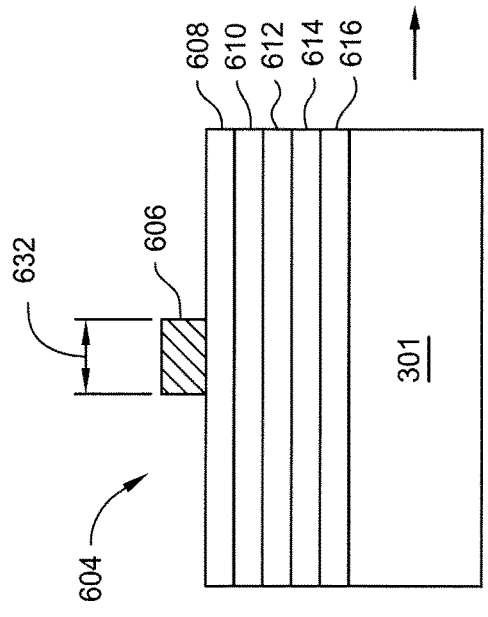
FIGS. 12A-12C illustrate another example of cross sectional views of a sequence for the patterning process of FIG. 10.

FIG. 10 is a flow diagram of another example of a method 1000 for 1000 begins at operation 1002 by providing the film stack 602 having the multiple mask layers (e.g., layers of 606, 608, 610, 612, 614, 616) disposed on the substrate 301. Similar to the examples above, the patterned photoresist layer 606 is formed on the film stack 602. Similarly, the cross sectional view of FIGS. 11A-11C shows the portion of the film stack 602 cutting along the line A-A from the top view of the film stack 602 in FIGS. 5A and 5B. The cross sectional view of FIGS. 12A-12C shows the portion of the film stack 602 cutting along the line B-B from the top view of the film stack 602 in FIGS. 5A and 5B.

Figure 12A:
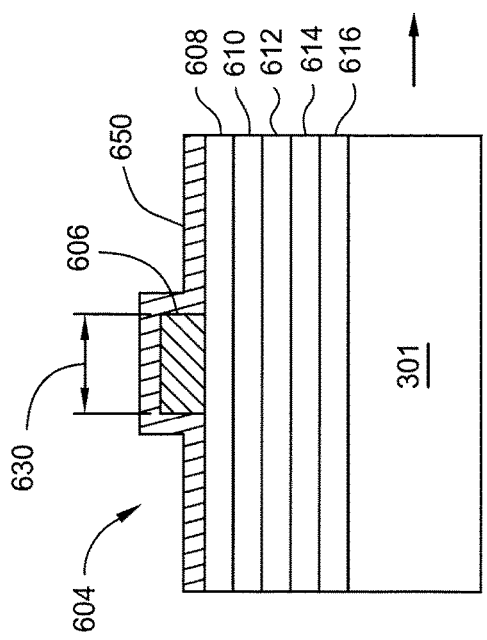
Figure 12C:
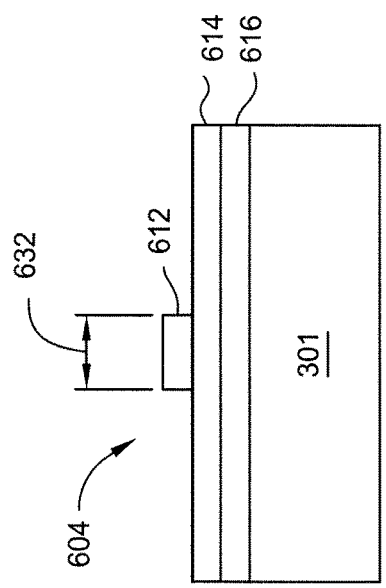

At operation 1104, a protection layer 650 is formed on the film stack 602, as shown in FIGS. 11A and 12A. The protection layer 650 may be formed by any suitable deposition processes, such as CVD, ALD, PVD, or the like. In one example, the protection layer 650 is a silicon containing layer. Suitable silicon containing layer includes $SiO_2$, SiON, SiN, SiOC, SiC, SiCN, SiOCN, or the like. In one example, carbon containing materials, such as amorphous carbon, or carbon nitride, may be utilized for the protection layer 650 as needed. The protection layer 650 is formed as a blanket layer across the film stack 602.

At operation 1106, a first etching process (e.g., a directional etching process as described above at operation 406) is performed to laterally trim down the dimension of the patterned photoresist layer 606. The dimension of the patterned photoresist layer 606 is trimmed from the first pitch 630 to the second pitch 632, as shown in FIGS. 11B and 12B. While trimming the dimension of the patterned photoresist layer 606, the horizontal surface of the protection layer 650 is also etched or trimmed. Thus, after the etching process at operation 1106, the protection layer 650 is etched away and removed from the substrate 301 as well as trimming the patterned photoresist layer 606 to having the dimension to the desired second pitch 632.

Similarly, the directional etching process in this operation is similar to the directional etching process described above.

At operation 1008, as the trimmed photoresist layer 606 is trimmed down to have the desired dimension, a second etching process is then performed, using the trimmed patterned photoresist layer 606 as an etching mask to etch down the film stack 602, as shown in FIGS. 11O and 12C. In the example depicted in FIGS. 11C and 12C, the upper layer 608 and the lower layer 610 is etched away, transferring the features defined by the patterned photoresist layer 606 to the first dielectric layer 612, as shown in FIG. 12C. In the areas with higher etching rate, the features may be even further transferred down to the metal dielectric layer 614, as shown in FIG. 11O.

The second etching process at operation 1008 may be performed in the processing chamber 100 as depicted in FIG. 1. The etching gas mixture includes at least a halogen containing gas. It is noted that the etching gas mixture as selected at this operation may include a single gas mixture to etch the film stack 602 or multiple gas mixtures sequentially supplied in the processing chamber 100 to etch each different materials in the film stack 602. For example, the multiple gas mixtures may include a first gas mixture comprising $CHF_3$ and $CH_4$ gas used to etch the upper layer 608; a second gas mixture comprising HBr, $N_2$ and $O_2$ used to etch the lower layer 610; a third gas mixture comprising $CHF_3$ and $O_2$ used to etch the first dielectric layer 612; a fourth gas mixture comprising $CH_4$, $Cl_2$ and $N_2$ used to etch the metal dielectric layer 614.

At operation 1010, after the second etching process, the openings 604 is formed in the film stack 602 with the desired second pitch 632 between the openings 604, as shown in FIG. 12C.

Thus, methods for patterning material layers in a film stack are provided. The patterning process utilizes a directional etching process to laterally etch a material layer in the film stack to incrementally and laterally reduce feature sizes of the material layer in the film stack until a desired small dimension feature is formed in the material layers in the film stack.

While the foregoing is directed to embodiments of the present disclosure, other and further embodiments of the disclosure may be devised without departing from the basic scope thereof, and the scope thereof is determined by the claims that follow.

We claim:

1. A method for patterning a film stack disposed on a substrate, comprising:
    performing a first etching process to etch a film stack disposed on a substrate, wherein the film stack includes a patterned photoresist layer disposed on an upper layer on a lower layer disposed on the substrate, wherein the patterned photoresist layer comprises openings defined between features and the features have a first pitch, wherein the first etching process removes between about 40 percent and about 95 percent of the lower layer exposed by the patterned photoresist layer from the film stack;
    performing a second etching process on the film stack; and
    upon completion of the second etching process, transferring the features into the upper or lower layer in the film stack having a second pitch, wherein the second pitch is shorter than the first pitch.

2. The method of claim 1, wherein the film stack further comprises a first dielectric layer and a metal dielectric layer disposed between the substrate and the lower layer.

3. The method of claim 1, wherein the second pitch is between about 20 percent and about 60 percent shorter than the first pitch.

4. The method of claim 1, wherein first etching process or the second etching process is a directional etching process.

5. The method of claim 4, wherein the directional etching process provides ions to the film stack having an incident angle from about 0 degrees to about 60 degrees or from about 120 degrees to about 180 degrees.

6. The method of claim 4, wherein the directional etching process is performed by supplying an etching gas mixture comprises at least an inert gas.

7. The method of claim 6, wherein the etching gas mixture in the directional etching process comprises Ar and $O_2$.

8. The method of claim 4, wherein the directional etching process reduces a dimension of the features from the first pitch to the second pitch.

9. The method of claim 1, further comprising:
    forming a protection layer on a surface of the film stack prior to performing the first etching process.

10. The method of claim 9, wherein the protection layer is a silicon containing layer.

11. The method of claim 10, wherein the silicon containing layer is $SiO_2$.

12. The method of claim 1, wherein the upper layer is a silicon containing layer.

13. The method of claim 1, wherein the lower layer is a carbon containing layer.

14. The method of claim 1, wherein the first etching process and the second etching process are performed at different processing chambers.

15. The method of claim 1, wherein an etching gas mixture used in the first or the second etching process comprises at least a halogen containing gas.

16. A method for patterning a film stack comprising:
    performing a directional etching process by supplying a gas mixture comprising an inert gas to etch a film stack on a substrate; and
    laterally reducing a dimension of features formed in the film stack from a first pitch to a second pitch.

17. The method of claim 16, wherein second pitch is between about 20% and about 60 percent shorter than the first pitch.

18. The method of claim 16, wherein the film stack includes a patterned photoresist layer disposed on an upper layer on a lower layer disposed on the substrate, wherein the upper layer is a silicon containing layer and the lower layer is a carbon containing layer.

19. The method of claim 16, further comprising:
    forming a protection layer on the film stack prior to performing the directional etching process.

20. A method for patterning a film stack comprising:
    providing etchants horizontally to a sidewall of a film stack disposed on a substrate, wherein the etchants comprises an inert gas, wherein the film stack comprises features formed in an upper layer disposed on a lower layer; and
    reducing a dimension of the features in the upper layer in the film stack from a first pitch to a second pitch while maintaining the dimension of the lower layer at the first pitch.

* * * * *